United States Patent
Nawata

(10) Patent No.: US 8,599,610 B2
(45) Date of Patent: Dec. 3, 2013

(54) NON-VOLATILE SEMICONDUCTOR STORAGE DEVICE HAVING A CONTROL CIRCUIT CONFIGURED TO EXECUTE A READ OPERATION

(75) Inventor: Hidefumi Nawata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 13/223,685

(22) Filed: Sep. 1, 2011

(65) Prior Publication Data

US 2012/0236636 A1 Sep. 20, 2012

(30) Foreign Application Priority Data

Mar. 17, 2011 (JP) ................................. 2011-058941

(51) Int. Cl.
*G11C 11/34* (2006.01)
(52) U.S. Cl.
USPC ............ 365/185.02; 365/185.01; 365/185.17; 365/185.18; 365/185.19; 365/185.24
(58) Field of Classification Search
USPC ............... 365/185.2, 185.17, 185.18, 185.19, 365/185.24, 185.01, 185.02
See application file for complete search history.

(56) References Cited

U.S. PATENT DOCUMENTS

| 6,879,520 B2 | 4/2005 | Hosono et al. | |
| 7,511,996 B2* | 3/2009 | Kim | 365/185.02 |
| 2008/0037327 A1* | 2/2008 | Park et al. | 365/185.19 |

FOREIGN PATENT DOCUMENTS

JP 2004-326866 11/2004

* cited by examiner

*Primary Examiner* — Thao Bui
(74) *Attorney, Agent, or Firm* — Oblon, Spivak, McClelland, Maier & Neustadt, L.L.P.

(57) ABSTRACT

A non-volatile semiconductor storage device according to an embodiment includes a memory cell array and a control circuit configured to execute a read operation. The control circuit refers to data of a reference memory cell which is adjacent to a selected memory cell and in which data is written after a data write operation on the selected memory cell. The control circuit applies a first read pass voltage to a non-selected word line adjacent to the selected word line, when the data of the reference memory cell is data causing the shift of the threshold voltage of the selected memory cell. The control circuit applies a second read pass voltage lower than the first read pass voltage to the non-selected word line, when the data of the reference memory cell is data not causing the shift of the threshold voltage of the selected memory cell.

12 Claims, 11 Drawing Sheets

COMPARATIVE EXAMPLE

COMPARATIVE EXAMPLE

COMPARATIVE EXAMPLE

READ ACCORDING TO FIRST EMBODIMENT

THRESHOLD VOLTAGE DISTRIBUTION
AT THE TIME OF READ OPERATION
ACCORDING TO FIRST EMBODIMENT
(THRESHOLD VOLTAGE INCREASES)

READ ACCORDING TO THIRD EMBODIMENT

READ ACCORDING TO FOURTH EMBODIMENT

NON-VOLATILE SEMICONDUCTOR STORAGE DEVICE HAVING A CONTROL CIRCUIT CONFIGURED TO EXECUTE A READ OPERATION

CROSS REFERENCE TO RELATED APPLICATION

This application is based upon and claims the benefit of priority from prior Japanese Patent Application No. 2011-58941, filed on Mar. 17, 2011, the entire contents of which are incorporated herein by reference.

BACKGROUND

1. Field

Embodiments described herein generally relate to an electrically rewritable non-volatile semiconductor storage device.

2. Description of the Related Art

With an increasing use of a large capacity of data such as images and videos in mobile devices, the demand for NAND type flash memories is rapidly increasing. In particular, by adopting a multi-valued storage technology for storing information of 2 bits or more in a memory cell, a larger capacity of information can be stored with a small chip area.

In highly-integrated flash memories with the advancement of miniaturization of cells, at the time of a write operation on memory cells adjacent to memory cells where a data write operation ends, threshold voltage distributions that indicate data of the memory cells where the write operation is completed are affected by interference of the adjacent cells. The influence of the interference appears in the form of an increase in the width of the threshold voltage distribution. In particular, when a multi-valued storage system is adopted, the width and distance of the threshold voltage distributions are narrowly set as compared with a two-valued storage system. As a result, the interference of the adjacent cells greatly affects reliability of data. For this reason, it is necessary to execute a read operation that can suppress an influence of a change in the threshold voltage caused by the interference from the adjacent cells.

DETAILED DESCRIPTION

A non-volatile semiconductor storage device according to an embodiment includes a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines; and a control circuit configured to execute a read operation corresponding to a threshold voltage of a selected memory cell, by applying a read voltage to a selected word line connected to the selected memory cell, and applying a read pass voltage to a non-selected word line connected to a non-selected memory cell, the read pass voltage making the non-selected memory cell conductive regardless of a threshold voltage thereof. The control circuit is configured to refer to data of a reference memory cell which is adjacent to the selected memory cell and in which data is written after a data write operation on the selected memory cell, at the time of the read operation. The control circuit is configured to apply a first read pass voltage as the read pass voltage to the non-selected word line adjacent to the selected word line, when the data of the reference memory cell is data causing the shift of the threshold voltage after the write operation on the selected memory cell. The control circuit is configured to apply a second read pass voltage lower than the first read pass voltage as the read pass voltage to the non-selected word line adjacent to the selected word line, when the data of the reference memory cell is data not causing the shift of the threshold voltage after the write operation on the selected memory cell.

Next, non-volatile semiconductor storage devices according to embodiments will be described with reference to the drawings.

First Embodiment

[Configuration]

Figure 1:
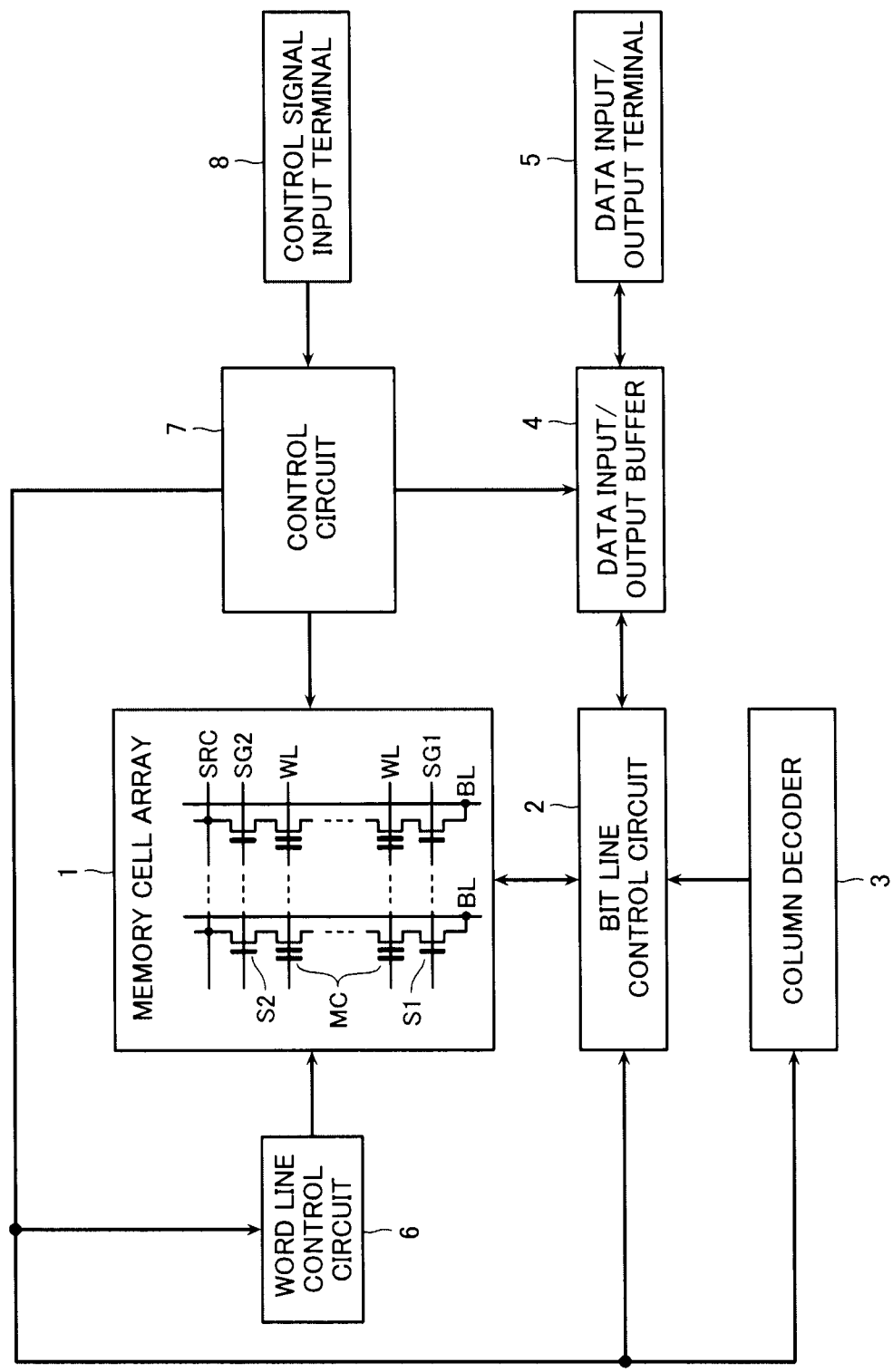
FIG. 1 is a block diagram illustrating the schematic configuration of a non-volatile semiconductor storage device according to an embodiment.

FIG. 1 illustrates the configuration of a non-volatile semiconductor storage device according to a first embodiment.

The non-volatile semiconductor storage device is a NAND type flash memory that adopts a four-valued storage system. The non-volatile semiconductor storage device includes a memory cell array 1 in which memory cells MC to store data are disposed in matrix. The memory cell array 1 includes a plurality of bit lines BL, a plurality of word lines WL, a source line SRC, and a plurality of memory cells MC. Each of the memory cell MC has a stack gate structure that has a floating gate functioning as a charge accumulating layer to accumulate charge and a control gate connected to the word line WL. The memory cells MC are configured such that data is electrically rewritable by charging or discharging of the floating gate, and are disposed in a matrix at intersections of the bit lines BL and the word lines WL.

To the memory cell array 1, a bit line control circuit 2 that controls a voltage of the bit line BL and a word line control circuit 6 that controls a voltage of the word line WL are connected. In this case, the bit line control circuit 2 reads data of the memory cells MC in the memory cell array 1 through the bit line BL. The bit line control circuit 2 applies a control voltage to the memory cells MC in the memory cell array 1 through the bit line BL and executes a write operation on the memory cells MC.

To the bit line control circuit 2, a column decoder and a data input/output buffer 4 are connected. The data read from the memory cells MC of the memory cell array 1 is output from the data input/output terminal 5 to the outside through the data input/output buffer 4. Further, write data input from the outside to the data input/output terminal 5 is input to the bit line control circuit 2 through the data input/output buffer 4 and is written in the designated memory cell MC.

The memory cell array 1, the bit line control circuit 2, the column decoder 3, the data input/output buffer 4, and the word line control circuit 6 are connected to a control circuit 7. The control circuit 7 generates a control signal to control the memory cell array 1, the bit line control circuit 2, the column decoder 3, the data input/output buffer 4, and the word line control circuit 6, according to a control signal input to a control signal input terminal 8.

Figure 2:
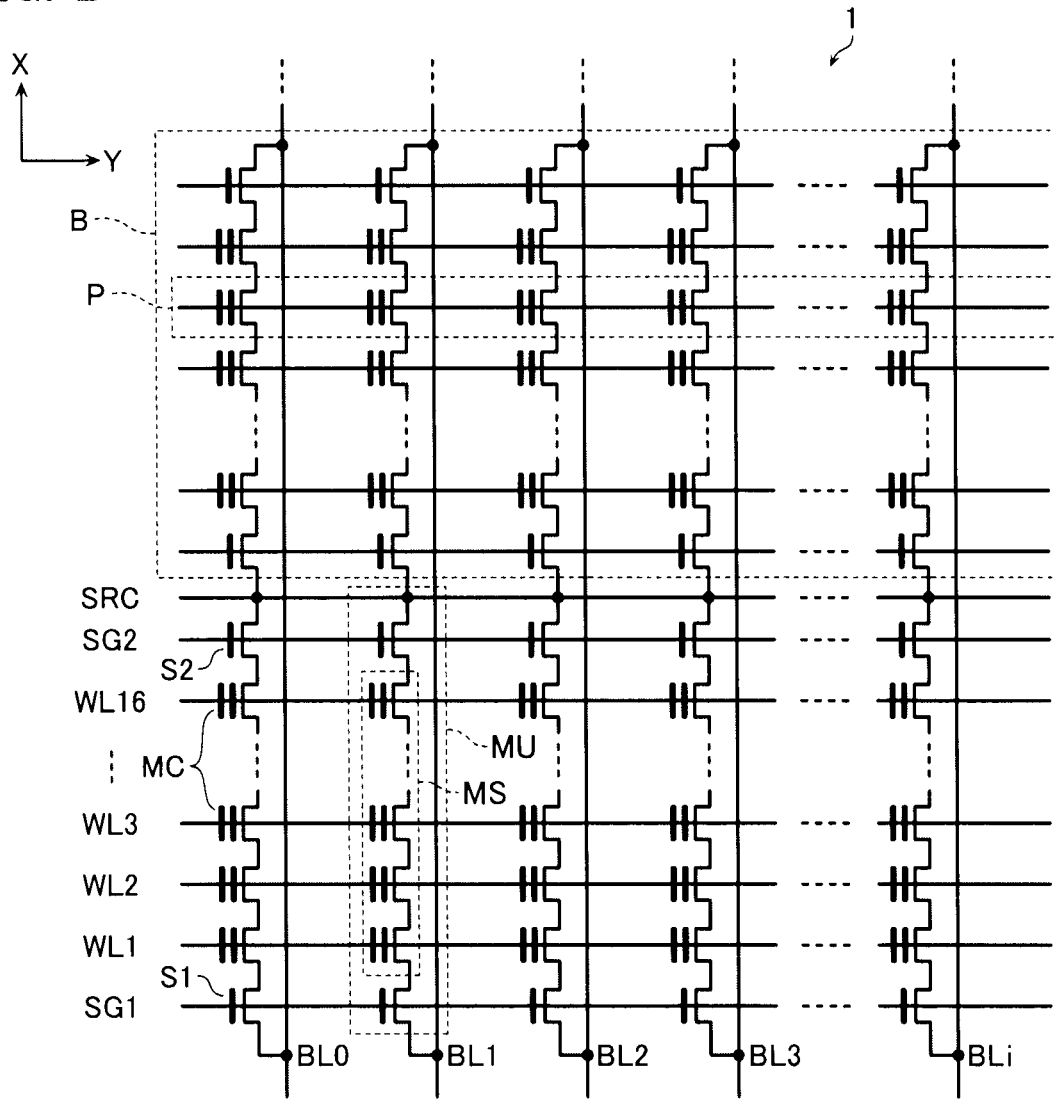
FIG. 2 is a circuit diagram illustrating the configuration of a memory cell array 1 illustrated in FIG. 1.

FIG. 2 illustrates the configuration of the memory cell array 1 illustrated in FIG. 1. As illustrated in FIG. 2, the memory cell array 1 is configured by a plurality of blocks B. In the memory cell array 1, data is erased (block erasing processing) by the block B basis. As illustrated in FIG. 2, the block B is configured to include a plurality of memory units MU. One memory unit MU is configured to include a memory string MS including, for example, 16 memory cells MC connected in series and first and second select gate transistors S1 and S2 connected to both ends of the memory string MS, respectively. One end of the first select gate transistor S1 is connected to the bit line BL and one end of the second select gate transistor S2 is connected to the source line SRC. Control gates of the memory cells MC that are disposed in line in a Y direction are commonly connected to any one of the word lines WL1 to WL16. Further, control gates of the first select gate transistors S1 that are disposed in line in the Y direction are commonly connected to a select gate line SG1 and control gates of the second select gate transistors S2 that are disposed in line in the Y direction are commonly connected to a select gate line SG2. A set P of a plurality of memory cells MC that are connected to one word line WL constitutes one page or multiple pages. For each set P, data is written and read.

[Data Storage System]

Figure 3:
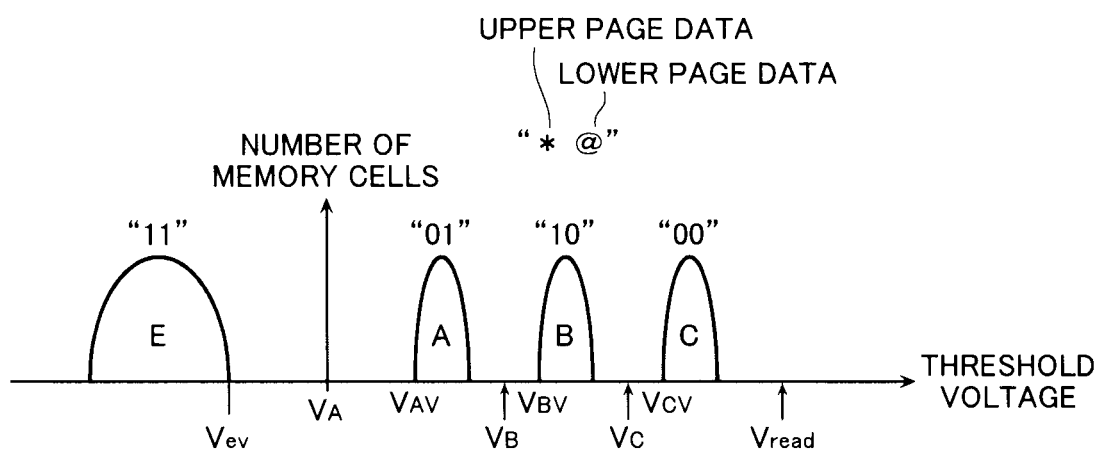
FIG. 3 is a diagram illustrating an example of write data in a four-valued storage flash memory.

The data storage system of the non-volatile semiconductor storage device will be schematically described. The non-volatile semiconductor storage device is configured such that threshold voltages of the memory cells MC have four distributions. FIG. 3 illustrates a relation between four-valued data (data "11", "01", "10", and "00") of two bits stored in the memory cells MC of the non-volatile semiconductor storage device and threshold voltage distributions of the memory cells MC.

In FIG. 3, voltages VA, VB, and VC are read voltages that are applied to the selected word lines WL when four kinds of data are read. Voltages VAV, VBV, and VCV represent verification voltages that are applied to verify whether the write operation is completed, after the write operation with threshold voltage distributions A, B, or C. A voltage Vread represents a read pass voltage that is applied to a non-selected memory cell MC of the memory string MS when data is read and makes a current flow through the non-selected memory cell MC, regardless of data held in the non-selected memory cell MC. A voltage Vev is an erase verification voltage that is applied to the memory cell MC to verify whether an erase operation is completed, when data of the memory cell MC is erased. A magnitude relationship between the voltages described above is Vev<VA<VAV<VB<VBV<VC<VCV<Vread.

In a threshold voltage distribution E of the memory cells MC after a block is erased, an upper limit value is a negative value and data "11" is allocated. The memory cells MC that show data "01", "10", and "00" in a write state constitute the positive threshold voltage distributions A, B, and C, respectively (that is, lower limit values of the distributions A, B, and C are positive values). The threshold voltage distribution A of the data "01" has a lowest voltage, the threshold voltage distribution C of the data "00" has a highest voltage, and the threshold voltage distribution B of the data "10" has an intermediate voltage of the threshold voltage distributions A and C. As illustrated in FIG. 3, 2-bit data of one memory cell MC includes lower page data and upper page data. When the 2-bit data is represented as data "*@", "*" indicates the upper page data and "@" indicates the lower page data.

[Write System]

Hereinafter, as an example of the write system, a system that writes lower page data and upper page data in memory cells MC by executing different data write processing, that is, two data write processing will be described.

Figure 4:
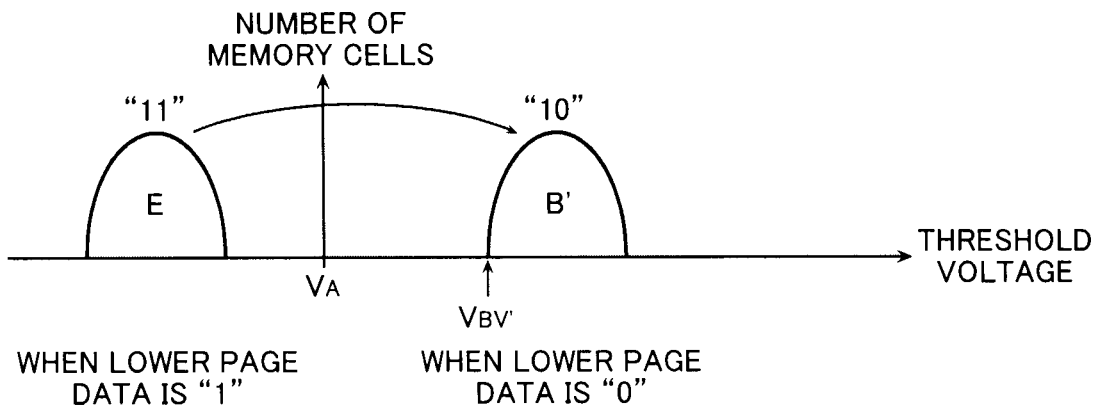
FIG. 4 is a conceptual diagram illustrating a write operation in the four-valued storage flash memory.

First, a write operation of the lower page data will be described with reference to FIG. 4. The write operation of the lower page data is executed on the basis of write data (lower page data) input from the outside of a chip. In FIG. 4, all of the memory cells MC show the threshold voltage distribution E of an erase state and store data "11". As illustrated in FIG. 4, if the write operation of the lower page data is executed, the threshold voltage distribution E of the memory cells MC is divided into two threshold voltage distributions E and B' corresponding to a value ("1" or "0") of the lower page data. That is, when the value of the lower page data is "1", the threshold voltage distribution E of the erase state is maintained.

Meanwhile, when the value of the lower page data is "0", a high electric field is applied to a tunnel oxide film of the memory cell MC, electrons are injected into a floating gate electrode, and a threshold voltage of the memory cell MC is increased by a certain amount. Specifically, a verification voltage VBV' is set and the electron injection operation and the verification operation are repeated. The electron injection is repeated until the threshold voltage of the memory cell MC becomes the verification voltage VBV' or more. As a result, a state of the memory cell MC changes to a write state (data "10").

Next, a write operation of the upper page data will be described with reference to FIG. 5. The write operation on the upper page data is executed on the basis of write data (upper page data) input from the outside of a chip and the lower page data already written in the memory cell MC.

Figure 5:
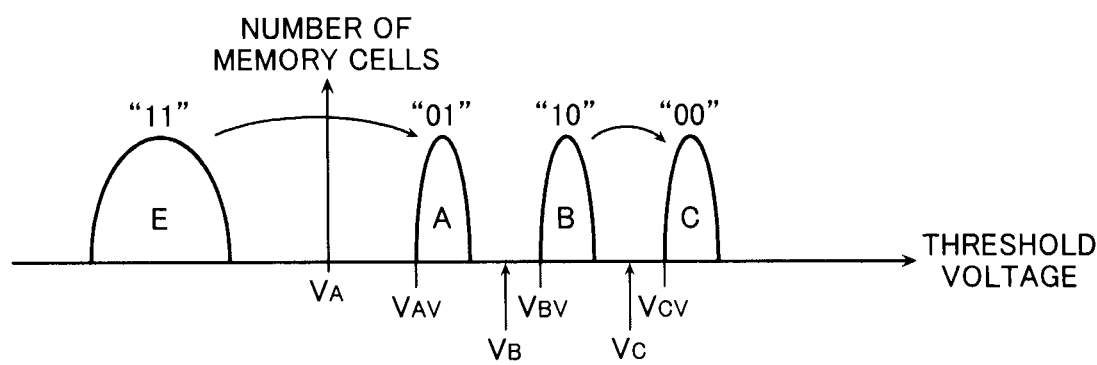
FIG. 5 is a conceptual diagram illustrating the write operation in the four-valued storage flash memory.

That is, as illustrated in FIG. 5, when the value of the upper page data is "1", the high electric field is not applied to the tunnel oxide film of the memory cell MC, such that a threshold voltage of the memory cell MC is prevented from increasing. As a result, the memory cell MC that has data "11" (threshold voltage distribution E of the erase state) maintains the data "11" and the memory cell MC that has data "10" (threshold voltage distribution B') maintains the data "10". However, a lower limit value of the threshold voltage distribution B' can be adjusted by referring to the regular verification voltage VBV higher than the verification voltage VBV'. Thereby, the width of the threshold voltage distribution B' may be narrowed and the threshold voltage distribution B may be formed.

Meanwhile, when the value of the upper page data is "0", the high electric field is applied to the tunnel oxide film of the memory cell MC, electrons are injected into a floating gate electrode, and a threshold voltage of the memory cell MC is increased by a certain amount. Specifically, the verification voltages VAV and VCV are set and the electron injection operation and the verification operation are repeated. The electron injection is repeated until the threshold voltage of the memory cell MC becomes the verification voltages VAV and VCV or higher. As a result, the data of the memory cell MC that has data "11" (threshold voltage distribution E of the erase state) changes to the data "01" of the threshold voltage distribution A and the data of the memory cell MC that has data "10" changes to the data "00" of the threshold voltage distribution C.

This is an example of the data write system in the non-volatile semiconductor storage device. The threshold voltage distribution E showing the erase state or any one of the three threshold voltage distributions A, B, and C are applied to the memory cell MC and data of two bits is stored in each memory cell. In a multi-valued storage system of 3 bits or more, in addition to the above operation, an operation for further dividing the threshold voltage distribution is only added, and the basic operation of the multi-valued storage system is the same as the above storage system.

[Read System]

Figure 6:
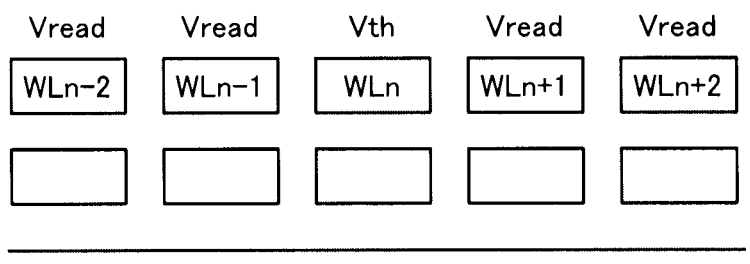
FIG. 6 is a diagram illustrating a voltage at the time of a read operation in the four-valued storage flash memory.

Next, a system for reading data from the memory cell MC where the data is written will be described. FIG. 6 schematically illustrates a cross-section of the memory cell array 1 taken along the bit line BL. FIG. 6 illustrates a voltage application state of the time when a read operation is executed on the memory cell MC connected to the selected word line WLn. During the read operation of the memory cell MC, a read voltage Vth (Vth=VA, VB or VC) is applied to the selected word line WLn and a read pass voltage Vread is applied to the non-selected word lines WLn−2, WLn−1, WLn+1, and WLn+2. At this time, the threshold voltage of the selected memory cell MC, that is, write data is determined on the basis of whether a current flows through a channel.

[Interference of Adjacent Cell at the Time of a Write Operation]

Next, the interference of the adjacent cell at the time of the write operation by a proximity effect will be described. The write operation on the memory cell MC is executed by the set P illustrated in FIG. 2 basis. In this case, data may be collectively written in all of the memory cells MC connected to one word line WL or data may be alternately written in the memory cells MC connected to an odd-numbered bit line and the memory cells MC connected to an even-numbered bit line among the unit of the set P. Hereinafter, a write system of the set P basis will be described with reference to FIGS. 7 and 8. In this case, an example of an upper page write operation will be described.

Figure 7:
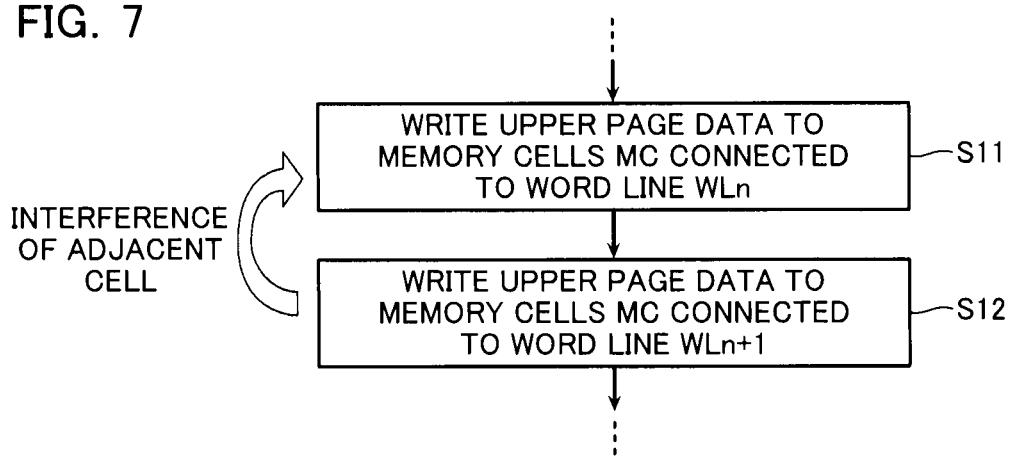
FIG. 7 is a flowchart illustrating a data write sequence.

As described above, the write operation on the memory cells MC is executed by the set P basis. Execution order of the write operation is order of the sets P of the memory cells MC that are connected to the word lines WL0, WL1, WL2, . . . , WLn, and WLn+1. As illustrated in FIG. 7, the upper page write operation is executed on the memory cells MC connected to the word line WLn (step S11). Next, the upper page write operation is executed on the memory cells MC connected to the word line WLn+1 (step S12). As such, during the upper page write operation that is executed by the set P basis, the threshold voltages of the memory cells MC are changed by the write operation on the memory cells MC of the adjacent set P. That is, by the write operation for applying the voltage to the memory cells MC connected to the word line WLn+1, the threshold voltages of the write operation-completed memory cells MC that are connected to the word line WLn are changed. This phenomenon is hereinafter called "interference of the adjacent cells". This phenomenon becomes remarkable when the distance between the memory cells MC decreases.

Figure 8A:
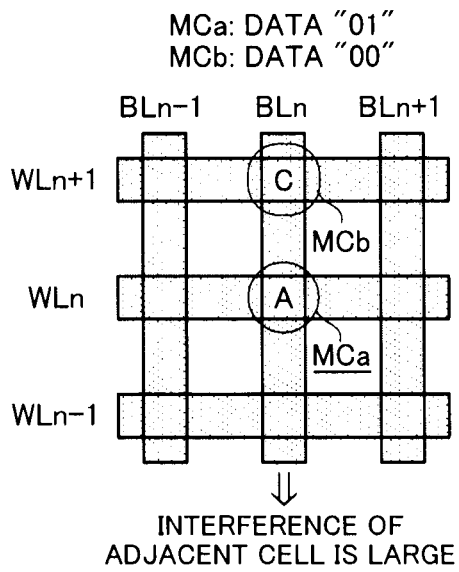
FIG. 8A is a diagram illustrating an influence by interference of adjacent cells during the data write operation.

The threshold voltage distribution illustrated in FIG. 5 may be changed even after the write operation on the selected memory cell MC ends by writing data in the adjacent cells. For example, as illustrated in FIG. 8A, the case where data "00" (threshold voltage distribution C) is written in an adjacent memory cell MCb after data "01" (threshold voltage distribution A) is written in a memory cell MCa is considered. In this case, the memory cell MCa suffers interference from the adjacent cell at the time of the write operation on the adjacent memory cell MCb. Therefore, the threshold voltage of the memory cell MCa is greatly shifted in a positive direction.

Figure 8B:
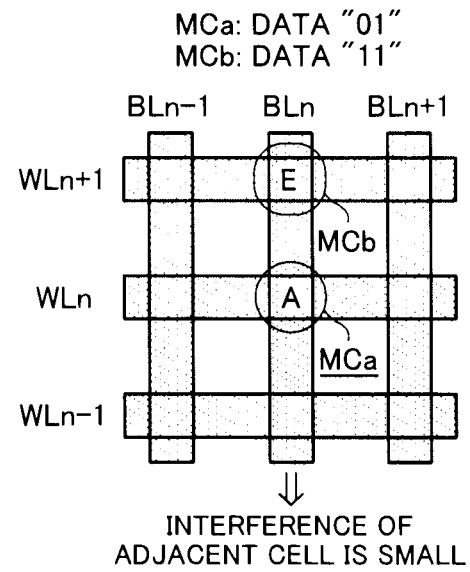
FIG. 8B is a diagram illustrating an influence by the interference of the adjacent cells during the data write operation.

Meanwhile, for example, as illustrated in FIG. 8B, the case where data "11" (threshold voltage distribution E) is written in an adjacent memory cell MCb after the data "01" (threshold voltage distribution A) is written in the memory cell MCa is considered. In this case, the write operation is not executed on the memory cell MCb and the memory cell MCb is maintained in the threshold voltage distribution E. As a result, since the high voltage is not applied to the memory cell MCb, the memory cell MCa rarely suffers the interference from the adjacent cell. Therefore, different from the example illustrated in FIG. 8A, the threshold voltage of the memory cell MCa is rarely shifted.

As such, the threshold voltage of the memory cell MCa greatly changes when the data "01", "10", and "00" (write state) are written in the adjacent memory cell MCb. Meanwhile, the threshold voltage of the memory cell MCa rarely changes when the adjacent memory cell MCb holds the data "11" (erase state). In this case, a large number of memory cells MC exist in the memory cell array 1. That is, in the memory cell array 1, data holding patterns illustrated in FIGS. 8A and 8B are mixed. As a result, the memory cells MC where the shift amount of the threshold voltage is large and the memory cells MC where the shift amount is small are mixed.

Figure 8C:
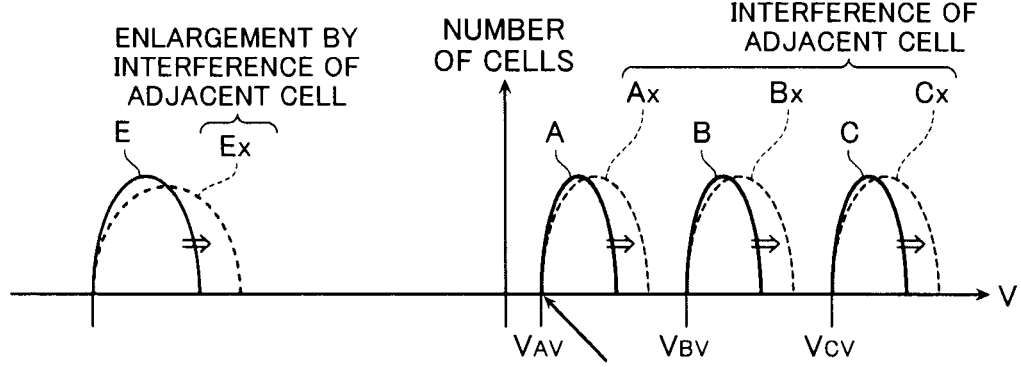
FIG. 8C is a diagram illustrating an influence by the interference of the adjacent cells during the data write operation.

Accordingly, as illustrated in FIG. 8C, the threshold voltage distribution A of the memory cell MCa becomes a threshold voltage distribution Ax that has the larger distribution width due to the interference of the adjacent memory cell MCb. In this case, a lower limit value of the threshold voltage distribution Ax is almost equal to a lower limit value of the original threshold voltage distribution A (refer to the arrow of FIG. 8C). For the same reason, the threshold voltage distributions B and C become threshold voltage distributions Bx and Cx that have the larger distribution widths, respectively. Lower limit values of the threshold voltage distributions Bx and Cx are almost equal to lower limit values of the original threshold voltage distributions B and C. The threshold voltage distribution E also becomes a threshold voltage distribution Ex that has the larger distribution width. In this way, the threshold voltage distributions Ax, Bx, Cx, and Ex where the distribution widths are increased cause erroneous read or the like.

[Read System According to a Comparative Example]

Figure 9:
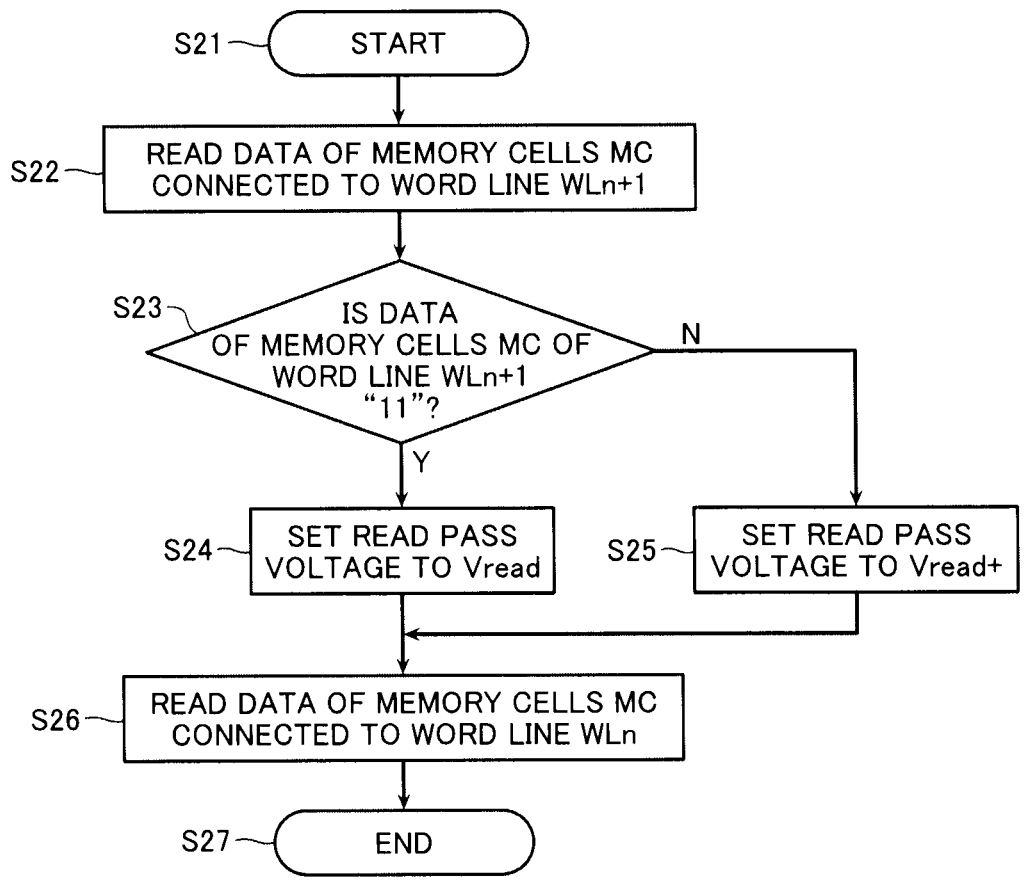
FIG. 9 is a flowchart illustrating a data read sequence according to a comparative example.

In view of the problem of the above write system, some measures may be taken when data is read from the memory cell MC. Before describing the first embodiment, first, a read system of a non-volatile semiconductor storage device according to the comparative example will be described. FIG. 9 is a flowchart illustrating a read operation according to the comparative example. When a read instruction signal is input from the control signal input terminal 8, the control circuit 7 starts the read operation on the memory cells MC connected to the word line WLn (step S21).

During the read operation, first, data written in the memory cells MC (reference memory cells) connected to the word line WLn+1 is read (step S22). Next, it is determined whether the data written in the memory cells MC connected to the word line WLn+1 is "11" (threshold voltage distribution E) or the other data ("01", "10", and "00" (threshold voltage distributions A, B, and C)) (step S23). As described above, when the data written in the memory cells MC connected to the word line WLn+1 is "11" (threshold voltage distribution E), an influence of the interference of the adjacent cell applied to the memory cells MC connected to the word line WLn due to the data write operation on the memory cells MC is small. Meanwhile, when the data written in the memory cells MC connected to the word line WLn+1 are "00" and "10" (threshold voltage distributions C and A), the influence of the interference of the adjacent cell applied to the memory cells MC connected to the word line WLn due to the data write operation on the memory cells MC is large (refer to FIG. 8). When the data written in the memory cells MC connected to the word line WLn+1 is "01" (threshold voltage distribution B), the slight influence of the interference of the adjacent cell exists.

Therefore, during the determination operation of step S23, when it is determined that the data written in the memory cells MC connected to the word line WLn+1 is "11", a read pass voltage that is applied to the non-selected word lines WLn+1 and WLn−1 is set to the voltage Vread (step S24). Meanwhile, when it is determined that the data written in the memory cells MC connected to the word line WLn+1 is not "11", the read pass voltage that is applied to the non-selected word lines WLn+1 and WLn−1 is set to the voltage Vread+ (>the voltage Vread) (step S25). Then, a data read operation on the memory cells MC that are connected to the word line WLn is executed (step S26). The data read operation is an operation for reading data from the plural memory cells MC connected to the word line WLn, that is, the memory cells MC in the set P illustrated in FIG. 2. At this time, the read pass voltage that is applied to the non-selected word lines WLn+1 and WLn−1 is set to the voltage Vread+ or the voltage Vread, on the basis of the data of the adjacent cell of each memory cell MC. For this reason, the data read operation is executed as two read operations that apply two kinds of read pass voltages. Then, the read operation on the memory cells MC that are connected to the word line WLn ends (step S27).

Figure 10:
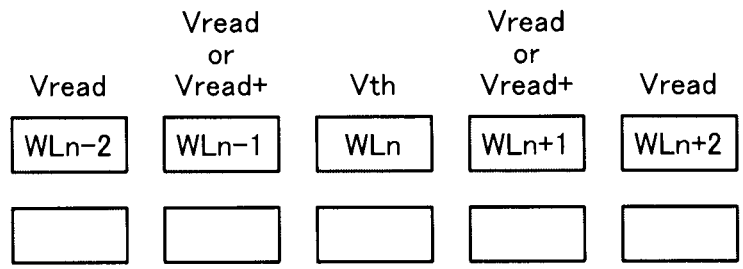
FIG. 10 is a diagram illustrating a voltage at the time of a read operation according to the comparative example.

FIG. 10 illustrates a voltage application state when the data is read from the memory cells MC connected to the selected word line WLn. The read operation is an operation for determining whether a current flows by applying a read voltage Vth (=VA, VB, or VC) to the selected word line WLn. In this case, during the read operation according to the comparative example, the read pass voltage that is applied to the non-selected word line WLn−1 or WLn+1 is set as Vread+ (>Vread). The read pass voltage Vread is applied to the non-selected word lines WLn-2 and WLn+2 or the other non-selected word line WL. When the read pass voltage Vread+ is not applied to the non-selected word line WLn−1 or WLn+1, the read pass voltage Vread is applied to the non-selected word lines WLn−1 and WLn+1.

Figure 11:
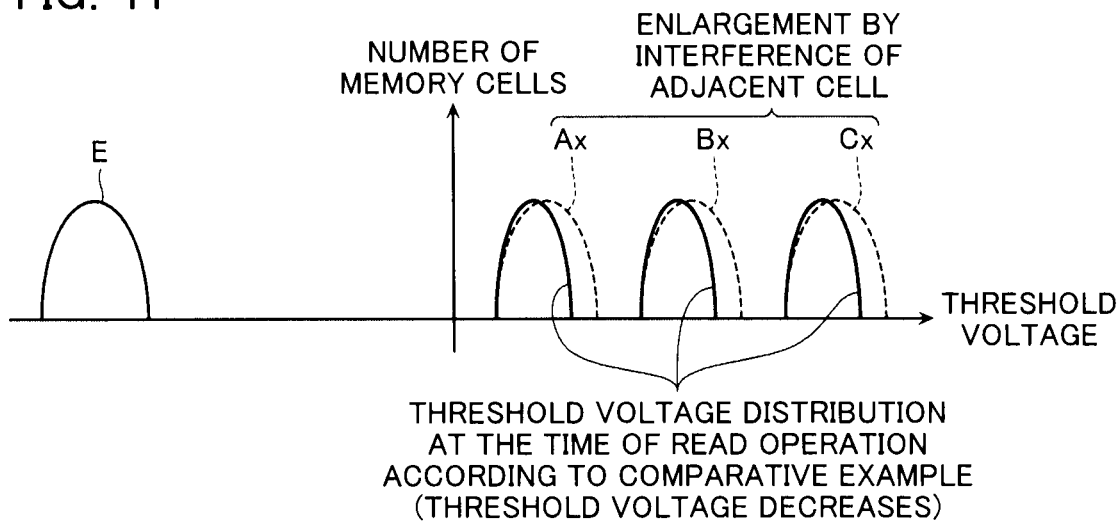
FIG. 11 is a diagram illustrating an effect of a data read operation according to the comparative example.

The threshold voltage distribution at the time of the read operation according to the comparative example will be described with reference to FIG. 11. FIG. 11 illustrates the threshold voltage distribution at the time of the read operation according to the comparative example. As described above, upper skirts of the threshold voltage distributions A, B, and C of the memory cells MC after the upper page write operation are enlarged by the data write operation on the adjacent memory cell MC and the threshold voltage distributions A, B, and C become the threshold voltage distributions Ax, Bx, and Cx that have the larger distribution widths (refer to FIG. 8C). Meanwhile, during the read operation according to the comparative example, when data (threshold voltage distributions A, B, and C) other than the data "11" is written in the adjacent memory cell MC and data is read from the memory cells MC affected by the interference of the adjacent cell, the read pass voltage Vread+ is applied to the adjacent word line WLn−1 or WLn+1. That is, during the read operation of the memory cells MC that exist in the upper skirt of the threshold voltage distributions Ax, Bx, and Cx, the read pass voltage Vread+ is applied to the adjacent word line WLn−1 or WLn+1. At this time, the threshold voltage where the selected memory cell MC becomes conductive is slightly decreased due to the voltage Vread+ applied to the adjacent word line WLn−1 or WLn+1. As a result, as illustrated in FIG. 11, the distribution widths of the threshold voltage distributions A, B, and C at the time of the read operation become narrower than the distribution widths of the threshold voltage distributions Ax, Bx, and Cx. As such, erroneous read can be decreased by the threshold voltage distributions A, B, and C where the distribution widths are narrowed.

However, during the read operation according to the comparative example, the high read pass voltage Vread+ is applied to the adjacent memory cell MC. For this reason, during the read operation, the electrons may be erroneously injected into the floating gate electrode of the adjacent memory cell MC and erroneous write (read disturbance) may occur.

[Read System According to the First Embodiment]

Figure 12:
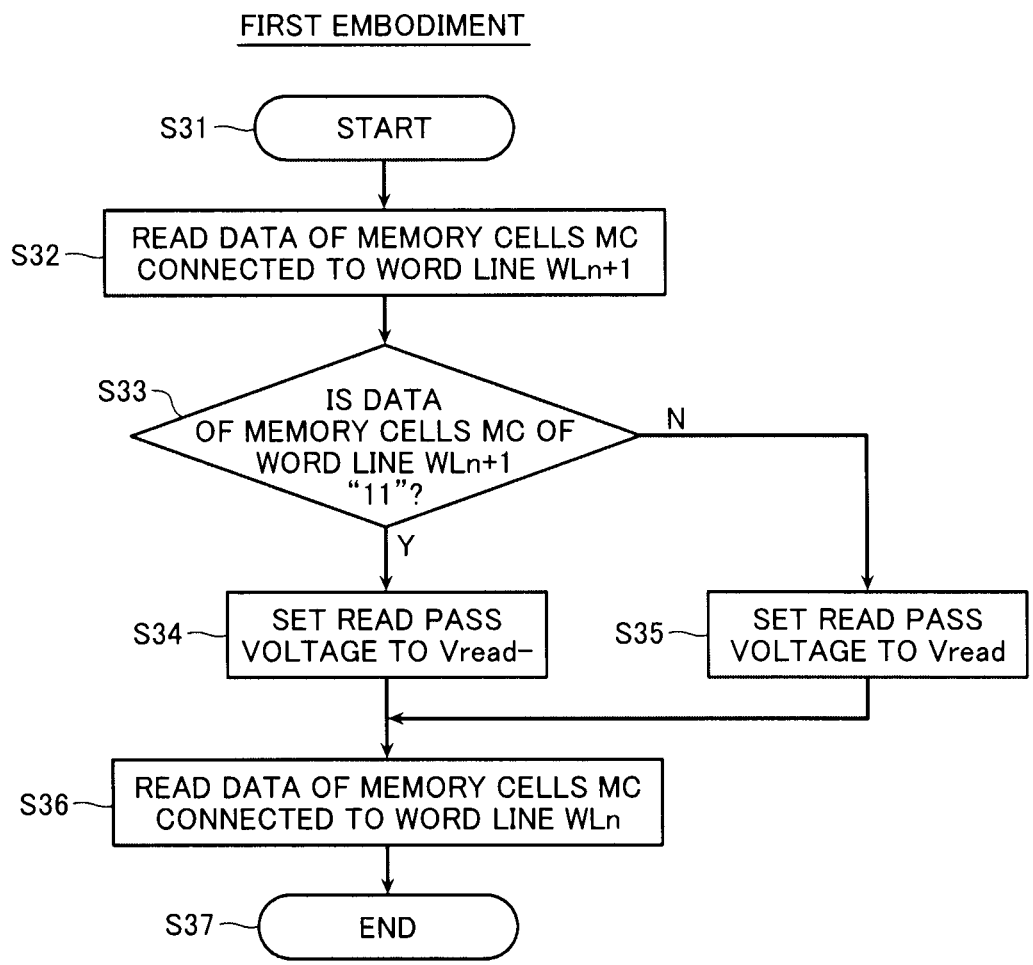
FIG. 12 is a flowchart illustrating a data read sequence according to the first embodiment.
Figure 13:
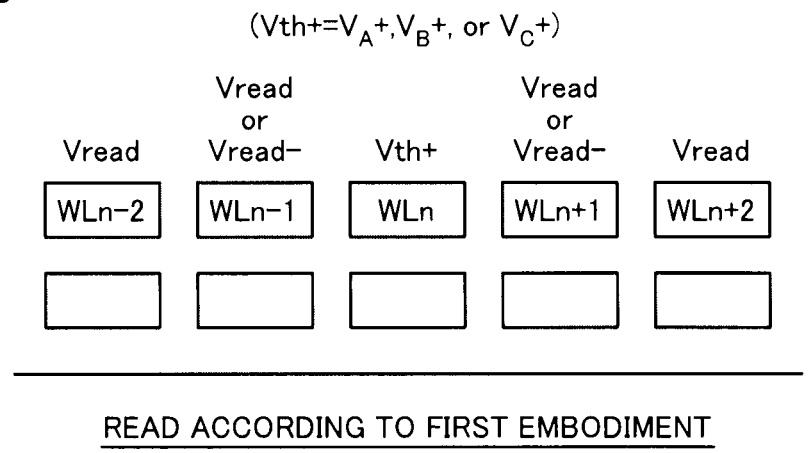
FIG. 13 is a diagram illustrating a voltage at the time of a read operation according to the first embodiment.
Figure 14:
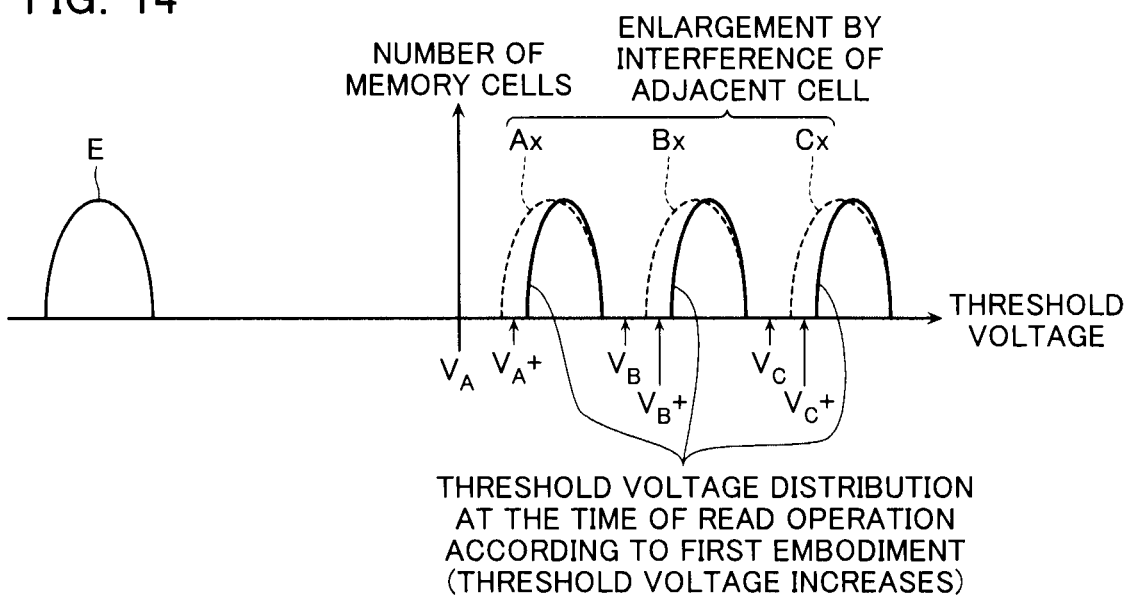
FIG. 14 is a diagram illustrating an effect of a data read operation according to the first embodiment.

In the first embodiment, a read system illustrated in FIGS. 12 to 14 is adopted in view of the problem of the read system according to the comparative example. Following processing is executed by the control circuit 7.

In the first embodiment, at the time of the read operation, the read voltage that is applied to the selected word line WLn and the read pass voltage that is applied to the adjacent word lines WLn−1 and WLn+1 are adjusted. Each voltage at the time of the read operation is set on the basis of the data written in the memory cell MC adjacent to the selected memory cell MC to which the read operation is executed.

The read operation will be described with reference to FIG. 12. FIG. 12 is a flowchart illustrating the read operation. An operation (steps S31 to S33) until the data of the memory cells MC (reference memory cells) connected to the word line WLn+1 is determined after the read operation starts is the same as the operation (steps S21 to S23 of FIG. 9) corresponding to the comparative example.

In the determination operation of step S33, when it is determined that data written in the memory cells MC connected to the word line WLn+1 is "11", the read pass voltage that is applied to the non-selected word lines WLn+1 and WLn−1 is set to the voltage Vread− (<Vread) (step S34). In this case, the read voltage that is applied to the selected word line WL is set to the voltage Vth+ (>Vth). The read pass voltage of any one of the non-selected word lines WLn+1 and WLn−1 may be set to the voltage Vread− (<Vread).

Meanwhile, when it is determined that the data written in the memory cells MC connected to the word line WLn+1 is not "11", the read pass voltage that is applied to the non-selected word lines WLn+1 and WLn−1 is set to the voltage Vread (step S35). Even in this case, the read voltage that is applied to the selected word line is set to the voltage Vth+.

Then, a data read operation on the memory cells MC that are connected to the word line WLn is executed (step S36). The data read operation is an operation for reading data from the plural memory cells MC connected to the word line WLn, that is, the memory cells MC in the set P illustrated in FIG. 2. At this time, the read pass voltage that is applied to the non-selected word lines WLn+1 and WLn−1 is set to the voltage Vread− or the voltage Vread and the read voltage that is applied to the selected word line is set to the voltage Vth+, on the basis of the data of the adjacent cell of each memory cell MC. The data read operation is executed as two read operations using two kinds of read pass voltages. That is, first, the read pass voltage applied to the non-selected word lines WLn+1 and WLn−1 is set to the voltage Vread−, the read voltage is set to the voltage Vth+, and data is read from only the bit line BL where read data of the memory cells MC connected to the non-selected word line WLn+1 is "11". Next, the read pass voltage applied to the non-selected word lines WLn+1 and WLn−1 changes to the voltage Vread and data is read from only the bit line BL where the read data of the memory cells MC connected to the non-selected word line WLn+1 is data other than "11". The read order may be reversed. Then, the read operation on the memory cells MC that are connected to the word line WLn ends (step S37).

FIG. 13 illustrates a voltage application state when the data is read from the memory cells MC connected to the selected word line WLn. During the read operation according to the first embodiment, when the data written in the memory cells MC connected to the word line WLn+1 is "11", the read pass voltage that is applied to the non-selected word lines WLn−1 and WLn+1 is set to Vread− (<Vread). In this case, the read voltage that is applied to the selected word line WL is set to the voltage Vth+. The read voltage Vth+ that is applied to the selected word line WLn is any one of VA+, VB+, and VC+. The voltage VA+, VB+, or VC+ is a voltage that is higher than the voltage VA, VB, or VC, respectively (VA+>VA, VB+>VB, and VC+>VC).

When it is determined that the data written in the memory cells MC connected to the word line WLn+1 is not "11", the read pass voltage Vread is applied to the non-selected word lines WLn−1 and WLn+1, and the other non-selected word lines WL. Even in this case, the read voltage Vth+ (=VA+, VB+, or VC+) is applied to the selected word line WLn.

[Effect]

The threshold voltage distribution at the time of the read operation according to this embodiment will be described with reference to FIG. 14. FIG. 14 illustrates the threshold voltage distribution at the time of the read operation according to this embodiment. As described above, upper skirts of the threshold voltage distributions A, B, and C of the memory cells MC after the upper page write operation are enlarged by the data write operation on the adjacent memory cell MC. The threshold voltage distributions A, B, and C become the threshold voltage distributions Ax, Bx, and Cx that have the larger distribution widths (refer to FIG. 8C). Meanwhile, during the read operation according to this embodiment, when the data "11" is written in the adjacent memory cell MC and data is read from the memory cells MC not affected by the interference of the adjacent cell, the read pass voltage Vread− is applied to the adjacent word lines WLn−1 and WLn+1. That is, during the read operation of the memory cells MC that exist in the lower skirt of the threshold voltage distributions Ax, Bx, and Cx, the read pass voltage Vread− is applied to the adjacent word line WLn−1 and WLn+1. At this time, the threshold voltage where the selected memory cell MC becomes conductive is slightly increased by the voltage Vread− applied to the adjacent word lines WLn−1 and WLn+1. As a result, as illustrated in FIG. 14, the distribution widths of the threshold voltage distributions A, B, and C at the time of the read operation become narrower than the distribution widths of the threshold voltage distributions Ax, Bx, and Cx, such that lower skirts move upward. In this case, the read voltage that is applied to the selected word line WL is set to the voltage Vth+. The value of the voltage Vth+ (=VA+, VB+ or VC+) is determined such that the data can be read from the threshold voltage distributions A, B, and C that have narrow distribution width. The voltage Vth+ is set to the voltage between the threshold voltage distributions A, B, and C. As such, erroneous read can be decreased by reading the threshold voltage distributions A, B, and C where the distribution widths are narrowed using the voltage Vth+.

According to the read operation in this embodiment, the high read pass voltage Vread+ is not applied to the adjacent memory cell MC. For this reason, the electrons are not erroneously injected into the floating gate electrode of the adjacent memory cell MC at the time of the read operation and erroneous write (read disturbance) can be prevented.

Second Embodiment

Next, a non-volatile semiconductor storage device according to the second embodiment will be described with reference to FIG. 15. The entire configuration of the non-volatile semiconductor storage device according to this embodiment is the same as that of the first embodiment and the overlapped description is omitted. The components similar to those of the first embodiment are denoted by the same reference numerals and the overlapped description is omitted.

In the first embodiment, adjustment of the voltage at the time of the read operation is executed when the data written in the memory cells MC connected to the adjacent word line WL is "11" (threshold voltage distribution E). Meanwhile, a correction write operation according to this embodiment is different from that of the first embodiment in that the adjustment of the voltage at the time of the read operation is executed when the data written in the memory cells MC connected to the adjacent word line WL is "11" and "10" (threshold voltage distributions E and B). Hereinafter, the second embodiment will be described with reference to FIG. 15.

Figure 15:
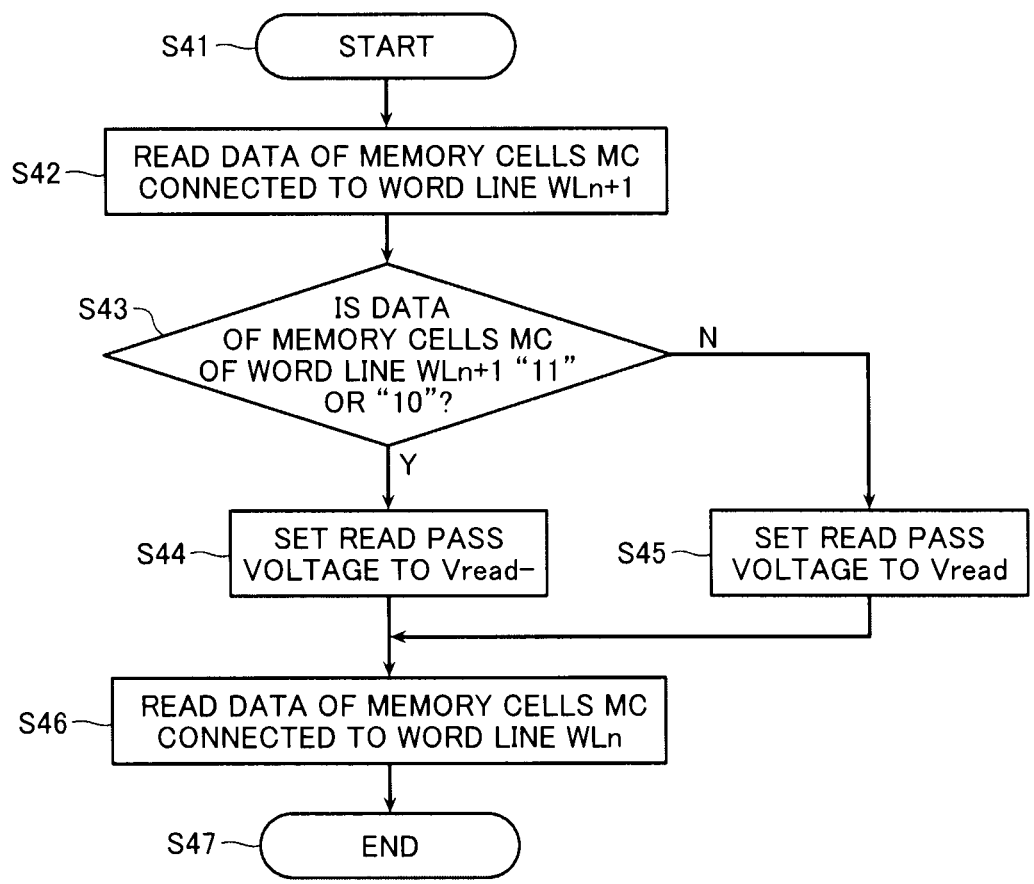
FIG. 15 is a flowchart illustrating a data read sequence according to a second embodiment.

FIG. 15 is a flowchart illustrating the read operation according to this embodiment. In this case, an operation (steps S41 and S42) until data of the memory cells MC (reference memory cells) connected to the word line WLn+1 is read after the read operation starts is the same as the operation (steps S31 and S32 of FIG. 12) corresponding to the first embodiment.

Next, it is determined whether the data written in the memory cells MC connected to the word line WLn+1 is "11" or "10" (threshold voltage distributions E and B) or the other data ("01" and "00" (threshold voltage distributions A and C)) (step S43). During the determination operation of step S43, when it is determined that the data written in the memory cells MC connected to the word line WLn+1 is "11" or "10", the read pass voltage that is applied to the non-selected word lines WLn+1 and WLn−1 is set to the voltage Vread−(<Vread) (step S44). In this case, the read voltage that is applied to the selected word line WL is set to the voltage Vth+ (>Vth). The read pass voltage of any one of the non-selected word lines WLn+1 and WLn−1 may be set to the voltage Vread− (<Vread).

Meanwhile, when it is determined that the data written in the memory cells MC connected to the word line WLn+1 is not "11" or "10", the read pass voltage that is applied to the non-selected word lines WLn+1 and WLn−1 is set to the voltage Vread (step S45). Even in this case, the read voltage that is applied to the selected word line is set to the voltage Vth+.

Then, a data read operation on the memory cells MC that are connected to the word line WLn is executed (step S46). The data read operation is an operation for reading data from the plural memory cells MC connected to the word line WLn, that is, the memory cells MC in the set P illustrated in FIG. 2. At this time, the read pass voltage that is applied to the non-selected word lines WLn+1 and WLn−1 is set to the voltage Vread− or the voltage Vread and the read voltage that is applied to the selected word line is set to the voltage Vth+, on the basis of the data of the adjacent cell of each memory cell MC. The data read operation is executed as two read operations using two kinds of read pass voltages. The read operation on the memory cells MC that are connected to the word line WLn ends (step S47).

[Effect]

As described above, upper skirts of the threshold voltage distributions A, B, and C of the memory cells MC after the upper page write operation are enlarged by the data write operation on the adjacent memory cell MC. The threshold voltage distributions A, B, and C become the threshold voltage distributions Ax, Bx, and Cx that have the larger distribution widths (refer to FIG. 8C). In this case, the magnitude of influence of the interference of the adjacent memory cell MC is changed by the magnitude of the voltage applied when data is written in the adjacent memory cell MC. When the data "01" and "00" are written at the time of the upper page write operation on the adjacent memory cell MC, the large write voltage is needed to move the threshold voltage from the threshold voltage distribution E or B' (refer to FIG. 5). When the data "10" is written at the time of the upper page write operation on the adjacent memory cell MC, the threshold voltage needs to be moved from the threshold voltage distribution B'. However, the voltage may be lower than the write voltage when the data "01" and "00" is written in the adjacent memory cell MC (refer to FIG. 5). When the data "11" is held at the time of the upper page write operation on the adjacent memory cell MC, because the threshold voltage does not need to be moved from the threshold voltage distribution E, the write voltage is not needed (refer to FIG. 5). That is, the magnitude of influence of the interference when the data "11" and "10" (threshold voltage distributions E and B) is written in the adjacent memory cell MC may be weaker than that when the data "01" and "00" (threshold voltage distributions A and C) is written.

In this embodiment, the adjustment of the voltage at the time of the read operation is executed on the memory cell MC that is rarely affected or slightly affected by the interference of the adjacent cell by writing the data "11" and "10" (threshold voltage distributions E and B) in the adjacent memory cell MC. That is, during the read operation on the memory cells MC that exist in the lower skirts of the threshold voltage distributions Ax, Bx, and Cx, the read pass voltage Vread− is applied to the adjacent word lines WLn−1 and WLn+1. At this time, the threshold voltage where the selected memory cell MC becomes conductive is slightly increased by the voltage Vread− applied to the adjacent word lines WLn−1 and WLn+1. In this case, the read voltage that is applied to the selected word line WL is set to the voltage Vth+. During the read operation according to this embodiment, the distribution widths of the threshold voltage distributions A, B, and C at the time of the read operation become narrower, such that lower skirts move upward. By reading the threshold voltage distributions A, B, and C using the voltage Vth, erroneous read can be decreased.

According to the read operation in this embodiment, the high read pass voltage Vread+ is not applied to the adjacent memory cell MC. For this reason, the electrons are not erroneously injected into the floating gate electrode of the adjacent memory cell MC at the time of the read operation and erroneous write (read disturbance) can be prevented.

Third Embodiment

Next, a non-volatile semiconductor storage device according to the third embodiment will be described with reference to FIGS. 16 and 17. The entire configuration of the non-volatile semiconductor storage device according to this embodiment is the same as that of the first embodiment and the overlapped description is omitted. The components similar to those of the first embodiment are denoted by the same reference numerals and the overlapped description is omitted.

This embodiment is the same as the second embodiment in that the adjustment of the voltage at the time of the read operation is executed when the data written in the memory cells MC connected to the adjacent word line WL are "11" and "10" (threshold voltage distributions E and B). This embodiment is different from the second embodiment in that the different adjustments of the voltage is executed when the data written in the memory cells MC connected to the adjacent word line WL is "11" or "10". Hereinafter, the third embodiment will be described with reference to FIG. 16.

Figure 16:
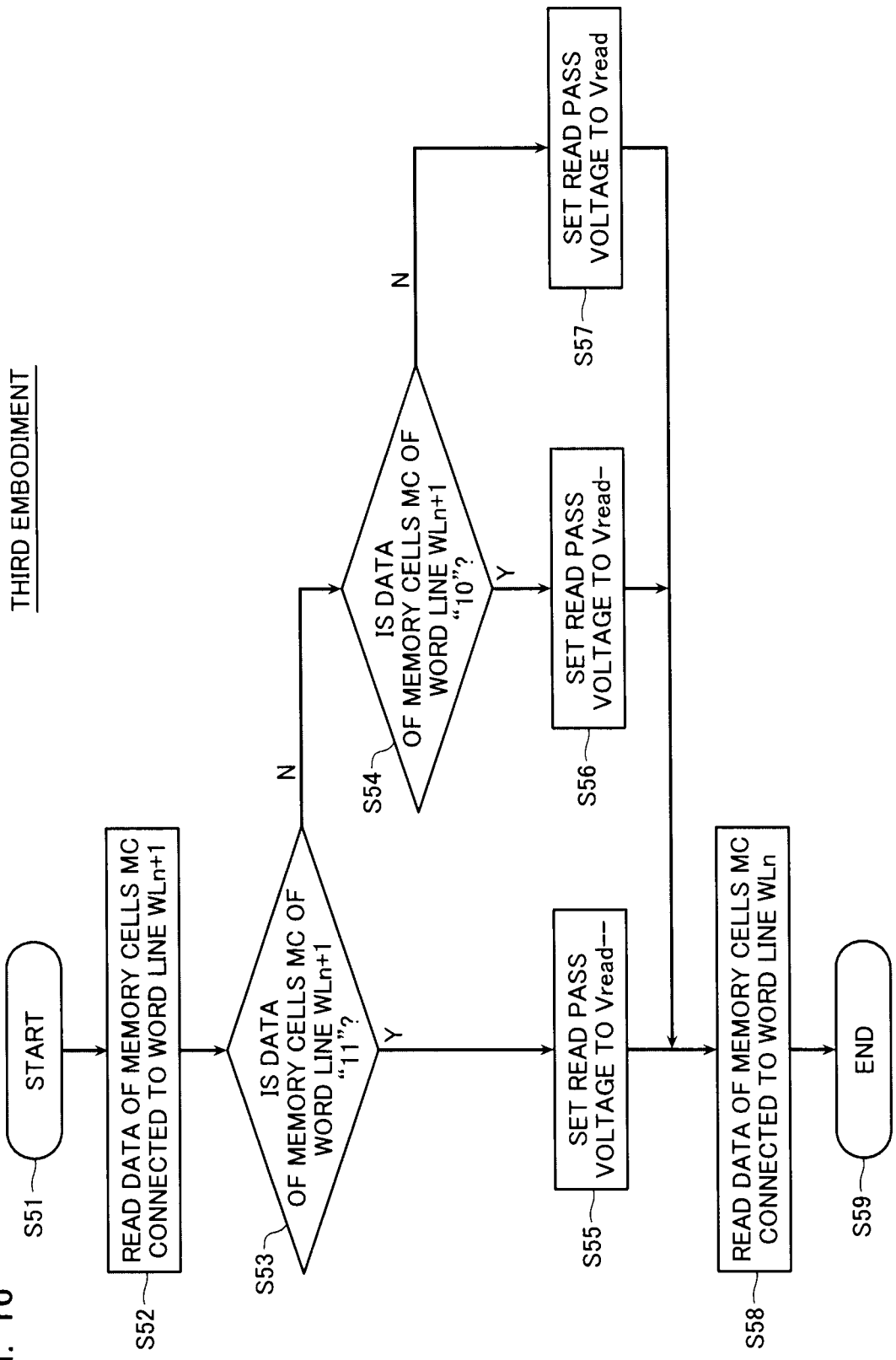
FIG. 16 is a flowchart illustrating a data read sequence according to a third embodiment.

FIG. 16 is a flowchart illustrating the read operation according to this embodiment. In this case, an operation (steps S51 and S52) until data of the memory cells MC (reference memory cells) connected to the word line WLn+1 is read after the read operation starts is the same as the operation (steps S31 and S32 of FIG. 12) corresponding to the first embodiment.

Next, it is determined whether the data written in the memory cells MC connected to the word line WLn+1 is "11" (threshold voltage distribution E) or the other data ("01", "10", and "00" (threshold voltage distributions A, B, and C)) (step S53). It is determined whether the data written in the memory cells MC connected to the word line WLn+1 is "10" (threshold voltage distribution B) or the other data ("01" and "00" (threshold voltage distributions A and C)) (step S54).

In the determination operation of step S53, when it is determined that the data written in the memory cells MC connected to the word line WLn+1 is "11", the read pass voltage that is applied to the non-selected word lines WLn+1 and WLn−1 is set to the voltage Vread− (step S55). In the determination operation of step S54, when it is determined that the data written in the memory cells MC connected to the word line WLn+1 is "10", the read pass voltage that is applied to the non-selected word lines WLn+1 and WLn−1 is set to the voltage Vread− (step S56). In this case, the read pass voltage is set to Vread−−<Vread−<Vread. In this case, the read voltage that is applied to the selected word line WL is set to the voltage Vth+ (>Vth). The read pass voltage of any one of the non-selected word lines WLn+1 and WLn−1 may be set to the voltage Vread−− (<Vread−). The read pass voltage of any one of the non-selected word lines WLn+1 and WLn−1 may be set to the voltage Vread− (<Vread).

Meanwhile, when it is determined that the data written in the memory cells MC connected to the word line WLn+1 is not "11" or "10", the read pass voltage that is applied to the non-selected word lines WLn+1 and WLn−1 is set to the voltage Vread (step S57). Even in this case, the read voltage that is applied to the selected word line is set to the voltage Vth+.

Then, a data read operation on the memory cells MC that are connected to the word line WLn is executed (step S58). The data read operation is an operation for reading data from the plural memory cells MC connected to the word line WLn, that is, the memory cells MC in the set P illustrated in FIG. 2. At this time, the read pass voltage that is applied to the non-selected word lines WLn+1 and WLn−1 is set to the voltage Vread−−, the voltage Vread−, or the voltage Vread and the read voltage that is applied to the selected word line is set to the voltage Vth+, on the basis of the data of the adjacent cell of each memory cell MC. The data read operation is executed as three read operations using three kinds of read pass voltages. The read operation on the memory cells MC that are connected to the word line WLn ends (step S59).

Figure 17:
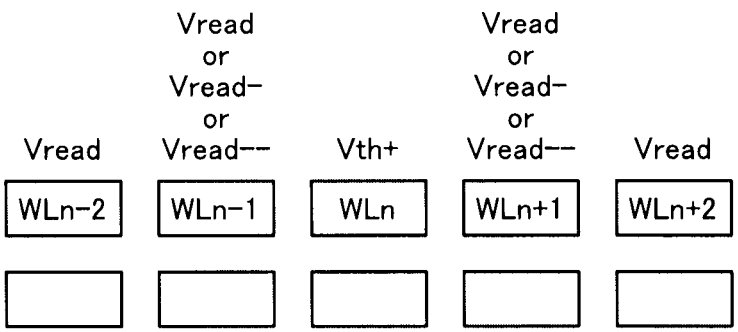
FIG. 17 is a diagram illustrating a voltage at the time of a read operation according to the third embodiment.

FIG. 17 illustrates a voltage application state when the data is read from the memory cells MC connected to the selected word line WLn. The read operation according to this embodiment is different from the read operation described above in that the voltage applied to the non-selected word lines WLn+1 and WLn−1 adjacent to the selected word line WLn is set to the voltage Vread, Vread−, or Vread−− (Vread−−<Vread−<Vread). In this case, when the data written in the memory cells MC connected to the word line WLn+1 is "11", the voltage that is applied to the non-selected word line WLn+1 is set to the voltage Vread−−. When the data written in the memory cells MC connected to the word line WLn+1 is "10", the voltage that is applied to the non-selected word lines WLn+1 is set to the voltage Vread−.

When it is determined that the data written in the memory cells MC connected to the word line WLn+1 is not "11" and "10", the read pass voltage Vread is applied to the non-selected word lines WLn−1 and WLn+1 or the other non-selected word line WL. Even in this case, the read voltage Vth+ is applied to the selected word line WLn.

[Effect]

In this embodiment, the adjustment of the voltage at the time of the read operation is executed on the memory cell MC that is rarely affected or slightly affected by the interference of the adjacent cell by writing the data "11" and "10" (threshold voltage distributions E and B) in the adjacent memory cell MC. At the time of the read operation, the voltage that is applied to the non-selected word line WLn+1 adjacent to the selected word line WLn is set as Vread− or Vread−. In this case, the threshold voltage where the selected memory cell MC becomes conductive is increased by the voltage Vread−− or Vread− applied to the adjacent word line WL. When the data "11" is written in the adjacent memory cell MC, the threshold voltage where the selected memory cell MC becomes conductive greatly increases. When the data "10" is written in the adjacent memory cell MC, the threshold voltage where the selected memory cell MC becomes conductive increases smaller than that when the data "11" is written. During the read operation according to this embodiment, the distribution widths of the threshold voltage distributions A, B, and C at the time of the read operation become narrower, such that lower skirts move upward. By reading the threshold voltage distributions A, B, and C using the voltage Vth+, erroneous read can be decreased. The dispersion of the threshold voltage where the selected memory cell MC becomes conductive can be minutely adjusted, on the basis of the data written in the adjacent memory cell MC.

According to the read operation in this embodiment, the high read pass voltage Vread+ is not applied to the adjacent memory cell MC. For this reason, the electrons are not erroneously injected into the floating gate electrode of the adjacent memory cell MC at the time of the read operation and erroneous write (read disturbance) can be prevented.

Fourth Embodiment

Next, a non-volatile semiconductor storage device according to the fourth embodiment will be described with reference to FIGS. 18 to 20. The entire configuration of the non-volatile semiconductor storage device according to this embodiment is the same as that of the first embodiment and the overlapped description is omitted. The components similar to those of the first embodiment are denoted by the same reference numerals and the overlapped description is omitted.

[Write System According to the Fourth Embodiment]

In the first to third embodiments, the threshold voltages of the memory cells MC of the non-volatile semiconductor storage device may have the four distributions. Meanwhile, the non-volatile semiconductor storage device according to this embodiment is different from the non-volatile semiconductor storage devices according to the embodiments described above in that the threshold voltages of the memory cells MC may have the two distributions.

Figure 18:
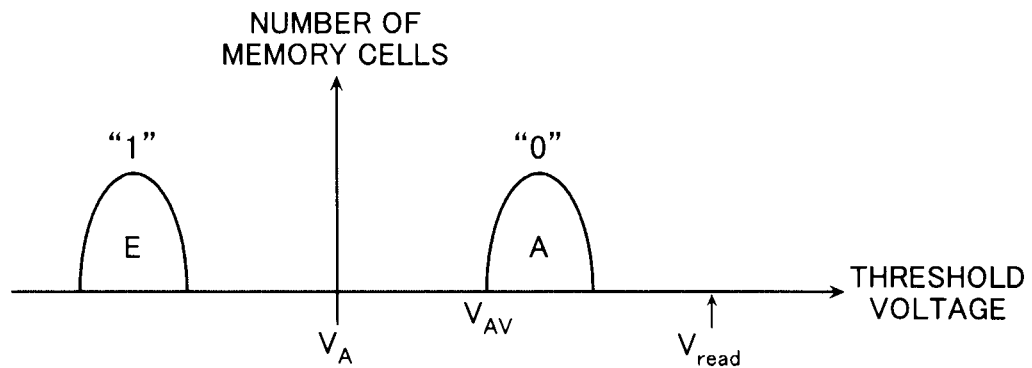
FIG. 18 is a diagram illustrating an example of write data in a two-valued storage flash memory.
Figure 19:
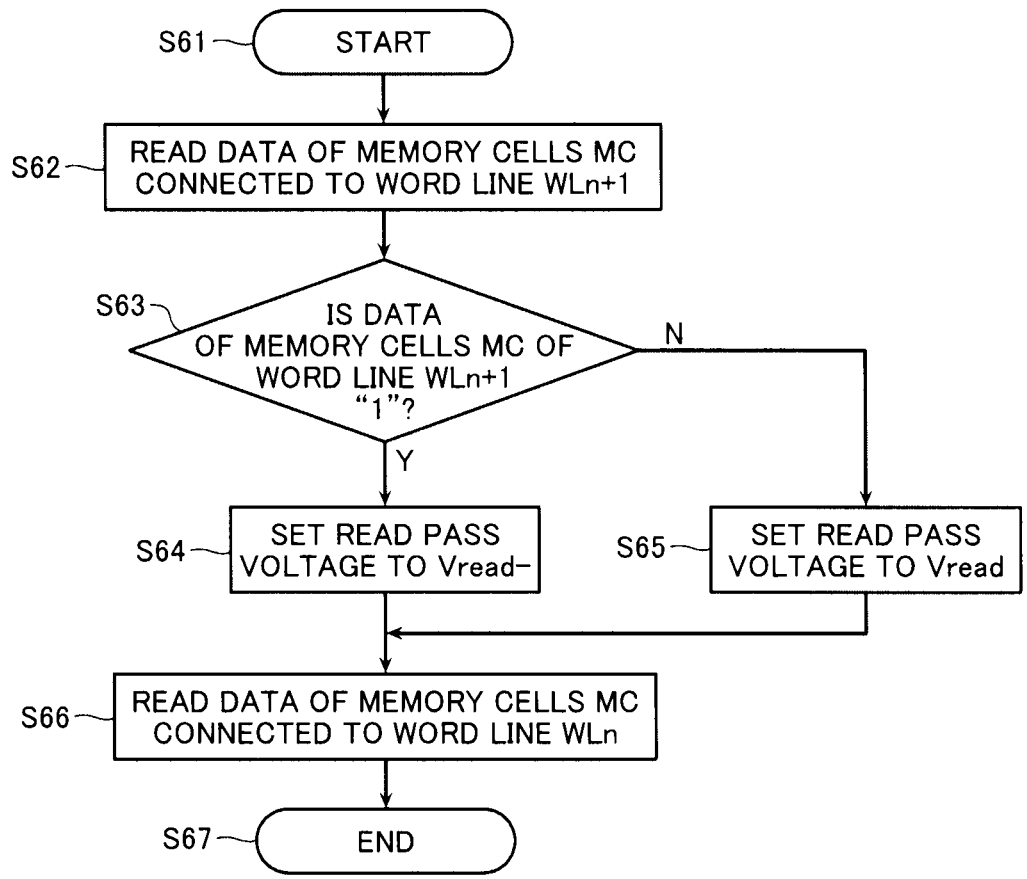
FIG. 19 is a flowchart illustrating a data read sequence according to a fourth embodiment.

FIG. 18 illustrates a relationship of two-valued data (data "1" and "0") of one bit stored in the memory cells MC of the non-volatile semiconductor storage device and threshold voltage distributions of the memory cells MC. In FIG. 18, the voltage VA is a voltage that is applied to the word line WL selected when data is read. The voltage VAV is a verification voltage that is applied to verify whether the write operation is completed after the write operation with the threshold voltage distribution A. In a threshold voltage distribution E of the memory cells MC after a block is erased, an upper limit value is a negative value and data "1" is allocated. In the positive threshold voltage distribution A of the memory cell MC after the write operation, data "0" is allocated.

Even in the fourth embodiment, at the time of the read operation, the read voltage that is applied to the selected word line WLn and the read pass voltage that is applied to the adjacent word lines WLn−1 and WLn+1 can be adjusted. Each voltage at the time of the read operation is set on the basis of data written in the memory cell MC adjacent to the selected memory cell MC to execute the read operation.

The read operation will be described with reference to FIG. 19. FIG. 19 is a flowchart illustrating the read operation. In this case, an operation (steps S61 and S62) until the data of the memory cells MC (reference memory cells) connected to the word line WLn+1 is read after the read operation starts is the same as the operation (steps S31 and S32 of FIG. 12) corresponding to the first embodiment.

Next, it is determined whether the data written in the memory cells MC connected to the word line WLn+1 is "1" (threshold voltage distribution E) or "0" (threshold voltage distribution A) (step S63). In the determination operation of step S63, when it is determined that data written in the memory cells MC connected to the word line WLn+1 is "1", the read pass voltage that is applied to the non-selected word lines WLn+1 and WLn−1 is set to the voltage Vread− (<Vread) (step S64). In this case, the read voltage that is applied to the selected word line WL is set to the voltage Vth+ (>Vth). The read pass voltage of any one of the non-selected word lines WLn+1 and WLn−1 may be set to the voltage Vread− (<Vread).

Meanwhile, when it is determined that the data written in the memory cells MC connected to the word line WLn+1 is "0", the read pass voltage that is applied to the non-selected word lines WLn+1 and WLn−1 is set to the voltage Vread (step S65). Even in this case, the read voltage that is applied to the selected word line is set to the voltage Vth+.

Then, a data read operation on the memory cells MC that are connected to the word line WLn is executed (step S66). The data read operation is an operation for reading data from the plural memory cells MC connected to the word line WLn, that is, the memory cells MC in the set P illustrated in FIG. 2. At this time, the read pass voltage that is applied to the non-selected word lines WLn+1 and WLn−1 is set to the voltage Vread− or the voltage Vread and the read voltage that is applied to the selected word line is set to the voltage Vth+, on the basis of the data of the adjacent cell of each memory cell MC. The data read operation is executed as two read operations using a combination of two kinds of read pass voltages and a read voltage. The read operation on the memory cells MC that are connected to the word line WLn ends (step S67).

Figure 20:
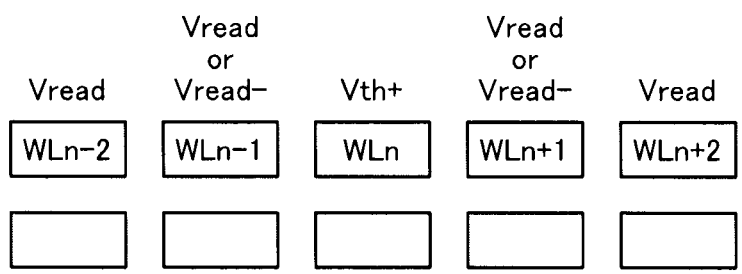
FIG. 20 is a diagram illustrating a voltage at the time of a read operation according to the fourth embodiment.

FIG. 20 illustrates a voltage application state when the data is read from the memory cells MC connected to the selected word line WLn. In the read operation according to this embodiment, when data written in the memory cells MC connected to the word line WLn+1 is "1", the read pass voltage that is applied to the non-selected word lines WLn−1 and WLn+1 is set to the voltage Vread− (<Vread). In this case, the read voltage that is applied to the selected word line WL is set to the voltage Vth+. The read voltage Vth+ that is applied to the selected word line WLn is VA+. The voltage VA+ is a voltage that is higher than the voltage VA (VA+ >VA).

When it is determined that the data written in the memory cells MC connected to the word line WLn+1 is not "1", the read pass voltage Vread is applied to the non-selected word lines WLn−2 and WLn+2, and the other non-selected word lines WL. Even in this case, the read voltage Vth+ (=VA+) is applied to the selected word line WLn.

[Effect]

In this embodiment, the adjustment of the voltage at the time of the read operation is executed on the memory cell MC that is rarely affected by the interference of the adjacent cell by writing the data "1" (threshold voltage distribution E) in the adjacent memory cell MC. At this time, the threshold voltage where the selected memory cell MC becomes conductive is slightly increased by the voltage Vread− applied to the adjacent word lines WLn−1 and WLn+1. During the read operation according to this embodiment, the distribution width of the threshold voltage distribution A at the time of the read operation becomes narrower, such that a lower skirt moves upward. By reading the threshold voltage distribution A using the voltage Vth+, erroneous read can be decreased.

According to the read operation in this embodiment, the high read pass voltage Vread+ is not applied to the adjacent memory cell MC. For this reason, the electrons are not erroneously injected into the floating gate electrode of the adjacent memory cell MC at the time of the read operation and erroneous write (read disturbance) can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, in the embodiments described above, the non-volatile semiconductor storage device of the four-valued storage system (2 bits/cell) and the two-valued storage system (1 bit/cell) is used. However, the invention is not limited thereto and the invention may be applied to multi-bit storage systems such as an eight-valued storage system.

In the embodiments described above, the system for executing the stepwise write processing on the upper page data/lower page data is described as the write system. However, a write system for executing write processing of two steps of foggy write processing to be rough write processing on the upper page data/lower page data and fine write processing to be accurate write processing on the upper page data/lower page data may be adopted. Alternatively, a write system for executing the accurate write processing on the upper page data/lower page data by one-time write processing without executing the stepwise write processing on the upper page data/lower page data may be adopted. When the threshold voltage distribution of the memory cell MC is affected by the interference of the adjacent memory cell MC, the read method according to the invention may be adopted. The invention may be applied to a so-called MONOS-type memory cell in which an insulating film as the charge accumulating layer traps the charge, without using the floating gate electrode.

What is claimed is:

1. A non-volatile semiconductor storage device, comprising:

a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines; and a control circuit configured to execute a read operation corresponding to a threshold voltage of a selected memory cell, by applying a read voltage to a selected word line connected to the selected memory cell, and applying a read pass voltage to a non-selected word line connected to a non-selected memory cell, the read pass voltage making the non-selected memory cell conductive regardless of a threshold voltage thereof, the memory cells being configured to store data of two bits corresponding to four kinds of threshold voltages E, A, B, and C in ascending order, the control circuit being configured to refer to data of a reference memory cell which is adjacent to the selected memory cell and in which data is written after a data write operation on the selected memory cell, at the time of the read operation, the control circuit being configured to apply a first read pass voltage as the read pass voltage to the non-selected word line adjacent to the selected word line, when the data of the reference memory cell is data causing shift of the threshold voltage after the write operation on the selected memory cell, the control circuit being configured to apply a second read pass voltage lower than the first read pass voltage as the read pass voltage to the non-selected word line adjacent to the selected word line, when the data of the reference memory cell is data not causing the shift of the threshold voltage after the data write operation on the selected memory cell, and the control circuit being configured to execute a first operation control, a second operation control and a third operation control selectively, the first operation control being a control in which the control circuit executes read control using the first read pass voltage, when the data of the reference memory cell is the data corresponding to the threshold voltages A and C, and executes read control using the second read pass voltage, when the data of the reference memory cell is the data corresponding to the threshold voltages E and B, the second operation control being a control in which the control circuit executes read control using the first read pass voltage, when the data of the reference memory cell is the data corresponding to the threshold voltages A, B, and C, and executes read control using the second read pass voltage, when the data of the reference memory cell is the data corresponding to the threshold voltage E, and the third operation control being a control in which the control circuit executes read control using the first read pass voltage, when the data of the reference memory cell is the data corresponding to the threshold voltages A and C, executes read control using the second read pass voltage, when the data of the reference memory cell is the data corresponding to the threshold voltage B, and executes read control applying a third read pass voltage lower than the second read pass voltage as the read pass voltage to the non-selected word line adjacent to the selected word line, when the data of the reference memory cell is the data corresponding to the threshold voltage E.

2. The non-volatile semiconductor storage device according to claim 1,
wherein the control circuit applies the read voltage based on a threshold voltage distribution of the selected memory cell, when the data of the reference memory cell is data causing the shift of the threshold voltage after the write operation on the selected memory cell.

3. The non-volatile semiconductor storage device according to claim 1,
wherein, the control circuit sequentially executes first read control to read data from a first bit line using the first read pass voltage, the first bit line being electrically connected to the reference memory cell storing data causing the shift of the threshold voltage after the write operation on the selected memory cell, and second read control to read data from a second bit line using the second read pass voltage, the second bit line being electrically connected to the reference memory cell storing data not causing the shift of the threshold voltage after the write operation on the selected memory cell.

4. The non-volatile semiconductor storage device according to claim 1,
wherein, the control circuit sets the second read pass voltage such that the smaller the shift amount of a threshold voltage shown by the data of the reference memory cell is, the lower the second read pass voltage becomes.

5. The non-volatile semiconductor storage device according to claim 1,
wherein the control circuit is configured to execute a write operation for writing data of two bits corresponding to four kinds of threshold voltages E, A, B, and C in ascending order to the memory cell, the write operation including an upper page write operation and a lower page write operation, and
the control circuit is configured to determine whether an upper page data of the reference memory cell is data causing the shift of the threshold voltage after the write operation on the selected memory cell.

6. A non-volatile semiconductor storage device, comprising:
a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines; and
a control circuit configured to execute a read operation corresponding to a threshold voltage of a selected memory cell, by applying a read voltage to a selected word line connected to the selected memory cell, and applying a read pass voltage to a non-selected word line connected to a non-selected memory cell, the read pass voltage making the non-selected memory cell conductive regardless of a threshold voltage thereof,
the memory cells being configured to store data of two bits corresponding to four kinds of threshold voltages E, A, B, and C in ascending order,
the control circuit being configured to execute a first read control and a second read control selectively, the first read control applying a first read pass voltage as the read pass voltage to all of the non-selected word lines, and the second read control applying a second read pass voltage lower than the first read pass voltage to a first non-selected word line adjacent to the selected word line and applying the first read pass voltage to second non-selected word lines which is non-selected word lines except the first non-selected word line, and
the control circuit being configured to execute a first operation control and a second operation control selectively,
the first operation control being a control in which the control circuit executes the first read control, when data of a reference memory cell is the data corresponding to the threshold voltages A and C, and executes the second read control, when the data of the reference memory cell is the data corresponding to the threshold voltages E and B, and
the second operation control being a control in which the control circuit executes the first read control, when the data of the reference memory cell is the data corresponding to the threshold voltages A, B, and C, and executes the second read control, when the data of the reference memory cell is the data corresponding to the threshold voltage E.

7. The non-volatile semiconductor storage device according to claim 6, wherein the control circuit applies the read voltage based on a threshold voltage distribution of the selected memory cell, when the data of the reference memory cell is data causing the shift of the threshold voltage after the write operation on the selected memory cell.

8. The non-volatile semiconductor storage device according to claim 6,
wherein the control circuit is configured to refer to data of a reference memory cell which is adjacent to the selected memory cell and in which data is written after a data write operation on the selected memory cell, and
the control circuit is configured to execute the first read control and the second read control selectively based on the data of the reference memory cell.

9. The non-volatile semiconductor storage device according to claim 6,
wherein the control circuit is configured to execute a write operation for writing data of two bits corresponding to four kinds of threshold voltages E, A, B, and C in ascending order to the memory cell, the write operation including an upper page write operation and a lower page write operation, and
the control circuit is configured to determine whether an upper page data of the reference memory cell is data causing the shift of the threshold voltage after the write operation on the selected memory cell.

10. A non-volatile semiconductor storage device, comprising:
a memory cell array that has NAND cell units in which a plurality of memory cells each having a control gate and a charge accumulating layer are connected in series, one end of the NAND cell unit being connected to a bit line through a first select gate transistor, the other end thereof being connected to a source line through a second select gate transistor, the control gate of each of the plurality of memory cells being connected to a word line and gates of the first and second select gate transistors being respectively connected to first and second select gate lines; and
a control circuit configured to execute a read operation corresponding to a threshold voltage of a selected memory cell, by applying a read voltage to a selected word line connected to the selected memory cell, and applying a read pass voltage to a non-selected word line connected to a non-selected memory cell, the read pass voltage making the non-selected memory cell conductive regardless of a threshold voltage thereof,
the memory cells being configured to store data of two bits corresponding to four kinds of threshold voltages E, A, B, and C in ascending order,
the control circuit being configured to execute a first read control, a second read control, and third read control selectively, the first read control applying a first read pass voltage as the read pass voltage to all of the non-selected word lines, the second read control applying a second read pass voltage lower than the first read pass voltage to a first non-selected word line adjacent to the selected word line and applying the first read pass voltage to second non-selected word lines which is non-selected word lines except the first non-selected word line, and the third read control applying a third read pass voltage lower than the second read pass voltage to the first non-selected word line and applying the first read pass voltage to the second non-selected word lines, and
the control circuit being configured to execute the first read control, when the data of the reference memory cell is the data corresponding to the threshold voltages A and C, execute the second read control, when the data of the reference memory cell is the data corresponding to the threshold voltage B, and execute the third read control, when the data of the reference memory cell is the data corresponding to the threshold voltage E.

11. The non-volatile semiconductor storage device according to claim 10,
wherein the control circuit applies the read voltage based on a threshold voltage distribution of the selected memory cell when the data of the reference memory cell is data causing the shift of the threshold voltage after the write operation on the selected memory cell.

12. The non-volatile semiconductor storage device according to claim 10,
wherein the control circuit is configured to refer to data of a reference memory cell which is adjacent to the selected memory cell and in which data is written after a data write operation on the selected memory cell, and
the control circuit is configured to execute the first read control, the second read control, and the third read control selectively based on the data of the reference memory cell.

* * * * *